US012588449B2

(12) United States Patent
Qiu

(10) Patent No.: US 12,588,449 B2
(45) Date of Patent: *\*Mar. 24, 2026**

(54) SEMICONDUCTOR FIN STRUCTURE CUT PROCESS

(71) Applicant: Shanghai Huali Integrated Circuit Corporation, Shanghai (CN)

(72) Inventor: Yanzhan Qiu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 790 days.

This patent is subject to a terminal disclaimer.

(21) Appl. No.: 17/945,292

(22) Filed: Sep. 15, 2022

(65) Prior Publication Data

US 2023/0162988 A1     May 25, 2023

(30) Foreign Application Priority Data

Nov. 23, 2021   (CN) .......................... 202111390542.0

(51) Int. Cl.
   *H10P 50/00* (2026.01)
   *H10P 76/20* (2026.01)

(52) U.S. Cl.
   CPC .......... *H10P 50/696* (2026.01); *H10P 50/694* (2026.01); *H10P 50/695* (2026.01); *H10P 76/2043* (2026.01)

(58) Field of Classification Search
   CPC ......... H01L 21/3088; H01L 21/823431; H01L 21/823821; H01L 21/845; H10D 86/215; H10D 84/0156; H10D 86/011; H10D 84/0193; H10D 30/024; H10P 50/696; H10P 50/695; H10P 50/693
   See application file for complete search history.

(56) References Cited

U.S. PATENT DOCUMENTS

| | | | | |
|---|---|---|---|---|
| 6,329,124 B1 * | 12/2001 | Rangarajan | ......... | H01L 21/3088 |
| | | | | 257/E21.235 |
| 11,637,194 B2 * | 4/2023 | Chiu | ................... | H01L 21/3065 |
| | | | | 438/283 |
| 2020/0227267 A1 * | 7/2020 | Baykan | ................ | H10D 84/853 |

* cited by examiner

*Primary Examiner* — Davienne N Monbleau
*Assistant Examiner* — Dmitri Mihaliov
(74) *Attorney, Agent, or Firm* — Banner & Witcoff, Ltd.

(57) ABSTRACT

The present application relates to a semiconductor fin structure cut process. The process includes: providing a semiconductor substrate and forming a plurality of fin structures on the semiconductor substrate, a gap being formed between every two adjacent fin structures; depositing a first dielectric layer, the first dielectric layer being filled in the gaps so that all fin structures are connected into a whole to form a semiconductor with fins; forming a plurality of pattern layer strips on the semiconductor with fins, a groove being formed between every two adjacent pattern layer strips, the fin structures closest to each pattern layer strip in the semiconductor with fins being necessary fin structures, attaching mask strips onto side surfaces of each pattern layer strip, the mask strips covering the necessary fin structures; etching the semiconductor with fins so that the unnecessary fin structures not covered by the mask strips are truncated.

10 Claims, 7 Drawing Sheets

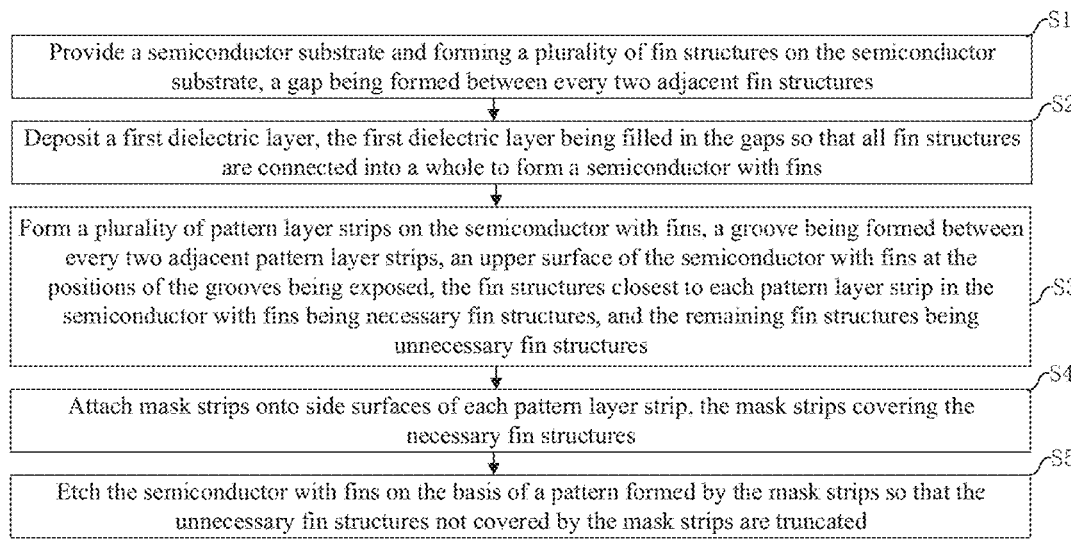

| | |
|---|---|
| Provide a semiconductor substrate and forming a plurality of fin structures on the semiconductor substrate, a gap being formed between every two adjacent fin structures | S1 |
| Deposit a first dielectric layer, the first dielectric layer being filled in the gaps so that all fin structures are connected into a whole to form a semiconductor with fins | S2 |
| Form a plurality of pattern layer strips on the semiconductor with fins, a groove being formed between every two adjacent pattern layer strips, an upper surface of the semiconductor with fins at the positions of the grooves being exposed, the fin structures closest to each pattern layer strip in the semiconductor with fins being necessary fin structures, and the remaining fin structures being unnecessary fin structures | S3 |
| Attach mask strips onto side surfaces of each pattern layer strip, the mask strips covering the necessary fin structures | S4 |
| Etch the semiconductor with fins on the basis of a pattern formed by the mask strips so that the unnecessary fin structures not covered by the mask strips are truncated | S5 |

FIG. 2

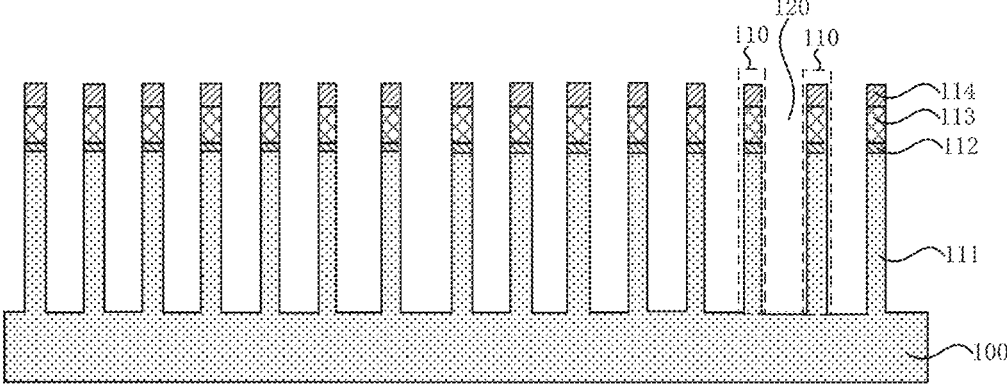

FIG. 2a

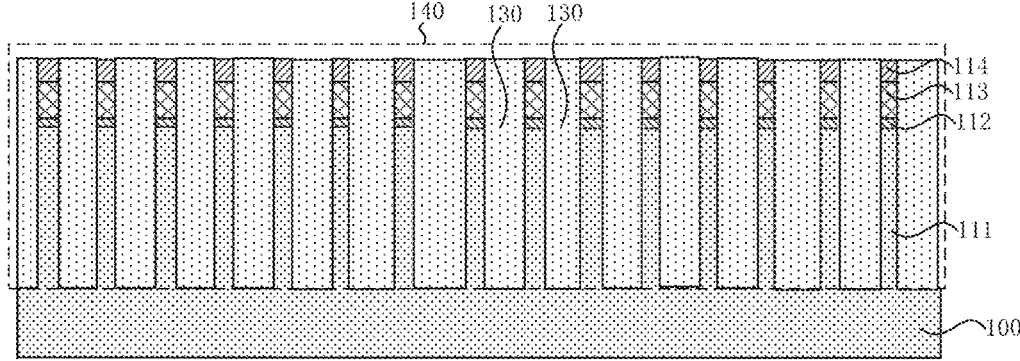

FIG. 2b

SEMICONDUCTOR FIN STRUCTURE CUT PROCESS

CROSS-REFERENCE TO RELATED APPLICATIONS

This application claims priority to Chinese Patent Application No. 202111390542.0, filed on Nov. 23, 2021, the disclosure of which is incorporated herein by reference in its entirety.

TECHNICAL FIELD

The present application relates to the technical field of semiconductor integrated circuit manufacturing, in particular to a semiconductor fin structure cut process.

BACKGROUND

For planar transistors, the current flows in the planar channel below the gate, and the current in the channel is controlled by controlling the voltage of the gate. In order to improve the gated field effect of the gate, those skilled in the art have designed Fin Field-Effect Transistor (FinFET). FinFET includes a fin structure for forming a channel, a source and a drain are respectively located at two ends of the fin structure, and a gate covers sidewalls and a top of the fin structure. The fin structure increases the area of the gate around the channel, which can strengthen the control of the gate over the channel and slow down the short channel effect in the planar transistor.

FIG. 1a illustrates a sectional structure of a device before a cut process in the prior art. FIG. 1b illustrates a sectional structure of a device after a cut process in the prior art. In the prior art, after several semiconductor fin structures 10 illustrated in FIG. 1a are formed on a wafer, unnecessary fin structures need to be removed through a cut process. Usually, a lithography pattern 20 is directly formed through a lithography process, and a truncated region 30 is defined on the wafer. Then, the wafer with several semiconductor fin structures is etched according to the lithography pattern 20 to remove the fin structures in the truncated region.

However, with the miniaturization of integrated circuit devices, the Critical Dimension (CD) of a single fin structure continues to shrink. Therefore, in the prior art, the requirement on the process window of forming a hard mask pattern through lithography is high and the lithography process is more difficult.

BRIEF SUMMARY

The present application provides a semiconductor fin structure cut process, which can solve the problems that the requirement of the cut method of the prior art on the lithography process window is relatively high and the difficulty in lithography is great for the fin structure with small critical dimension.

In order to solve the technical problems in the background, the present application provides a semiconductor fin structure cut process. The semiconductor fin structure cut process includes the following steps performed sequentially:

providing a semiconductor substrate and forming a plurality of fin structures on the semiconductor substrate, a gap being formed between every two adjacent fin structures;

depositing a first dielectric layer, the first dielectric layer being filled in the gaps so that all fin structures are connected into a whole to form a semiconductor with fins;

forming a plurality of pattern layer strips on the semiconductor with fins, a groove being formed between every two adjacent pattern layer strips, an upper surface of the semiconductor with fins at the positions of the grooves being exposed, the fin structures closest to each pattern layer strip in the semiconductor with fins being necessary fin structures, and the remaining fin structures being unnecessary fin structures;

attaching mask strips onto side surfaces of each pattern layer strip, the mask strips covering the necessary fin structures;

etching the semiconductor with fins on the basis of a pattern formed by the mask strips so that the unnecessary fin structures not covered by the mask strips are truncated.

In some examples, the step of depositing a first dielectric layer, the first dielectric layer being filled in the gaps so that all fin structures are connected into a whole to form a semiconductor with fins includes:

depositing a first dielectric layer, the first dielectric layer being filled in the gaps so that all fin structures are connected into a whole;

enabling tops of the fin structures connected into a whole to be covered with the first dielectric layer to form the semiconductor with fins.

In some examples, after the semiconductor with fins is formed, the semiconductor fin structure cut process further includes:

performing chemical-mechanical polishing to a surface layer of the fin to planarize the upper surface of the semiconductor with fins.

In some examples, the step of attaching mask strips onto side surfaces of each pattern layer strip, the mask strips covering the necessary fin structures includes:

depositing second dielectric, so that the second dielectric is attached onto bottom surfaces of the grooves and side surfaces and top surfaces of the pattern layer strips to form a second dielectric layer, the second dielectric layer attached onto the side surfaces of the pattern layer strips covering the fin structures closest to the side surfaces of the pattern layer strips;

etching the second dielectric layer to remove the second dielectric layer covering the bottom surfaces of the grooves and the top surfaces of the pattern layer strips, the remaining second dielectric layer covering the necessary fin structures to form mask strips.

In some examples, the step of depositing second dielectric includes:

depositing second dielectric through silicon oxide atoms at temperature ranging from 80° C. to 200° C., so that the second dielectric is attached onto the bottom surfaces of the grooves and the side surfaces and top surfaces of the pattern layer strips to form a second dielectric layer.

In some examples, the step of forming a plurality of pattern layer strips on the semiconductor with fins, a groove being formed between every two adjacent pattern layer strips, an upper surface of the semiconductor with fins at the positions of the grooves being exposed includes:

sequentially forming a hard mask layer, an anti-reflection layer and a photoresist layer on the semiconductor with fins;

etching the photoresist layer through a photolithography process so that the remaining photoresist layer forms a first pattern;

etching the anti-reflection layer and the hard mask layer on the basis of the photoresist layer with the first pattern, so that the first pattern is transferred into the anti-reflection layer and the hard mask layer;

performing etching to remove the anti-reflection layer with the first pattern and reserve the hard mask layer with the first pattern.

In some examples, the anti-reflective layer with the first pattern includes a plurality of the pattern layer strips, and the groove is formed between every two adjacent layer strips.

In some examples, after the step of etching the fin on the basis of a pattern formed by the mask strips so that the unnecessary fin structures not covered by the mask strips are truncated, roots of the unnecessary fin structures are reserved to a height ranging from 18 nm to 22 nm.

In some examples, after the step of etching the semiconductor with fins on the basis of a pattern formed by the mask strips so that the unnecessary fin structures not covered by the mask strips are truncated, the semiconductor fin structure cut process further includes:

forming a third dielectric layer through deposition so that the third dielectric layer is filled in a spacing groove between every two adjacent necessary fin structures.

In some examples, after the step of forming a third dielectric layer through deposition so that the third dielectric layer is filled in a spacing groove between every two adjacent necessary fin structures, an upper surface of the third dielectric layer is planarized through chemical-mechanical polishing.

The technical solution of the present application at least has the following advantages: in the present application, pattern layer strips with a wide width are firstly formed on the semiconductor with fins, a groove is formed between every two adjacent pattern layer strips, then the second dielectric layer attached onto the side surfaces of the pattern layer strips are enabled to cover the fin structures closest to the side surfaces of the pattern layer strips through the second dielectric layer deposition process, and the fin structures closest to the side surfaces of the pattern layer strips are necessary fin structures. Then, the second dielectric layer is etched, and the second dielectric layer attached to the side surfaces of the pattern layer strips is reserved to form mask strips. The mask strips protect the necessary fin structures, so that after the subsequent etching according to the pattern formed by the mask strips, the necessary fin structures are reserved, and the unnecessary fin structures are truncated. The requirement of this present application on the lithography process window is low, and it can solve the problem of great difficulty in lithography in the prior art.

BRIEF DESCRIPTION OF THE DRAWINGS

In order to more clearly describe the technical solutions in the specific embodiments of the present application or the prior art, the following will briefly introduce the drawings needed to be used in the description of the specific embodiments or the prior art. It is obvious that the drawings in the following description are some embodiments of the present application. For those skilled in the art, other drawings can be obtained according to these drawings without contributing any inventive labor.

FIG. 2 illustrates a flowchart of a semiconductor fin structure cut process provided by an embodiment of the present application.

FIG. 2a illustrates a sectional structure of a semiconductor with a plurality of fin structures in an embodiment of the present application.

FIG. 2b illustrates a semiconductor with fins formed after step S2 in an embodiment of the present application.

FIG. 6b illustrates a sectional structure of a device after planarization of an upper surface of the third dielectric layer illustrated in FIG. 6a.

DETAILED DESCRIPTION

Figure 1A:
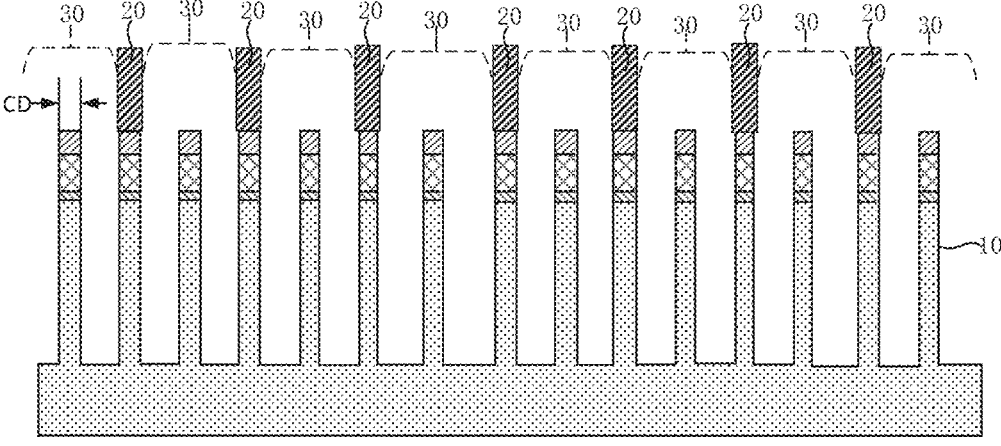
FIG. 1a illustrates a sectional structure of a device before a cut process in the prior art.
Figure 1B:
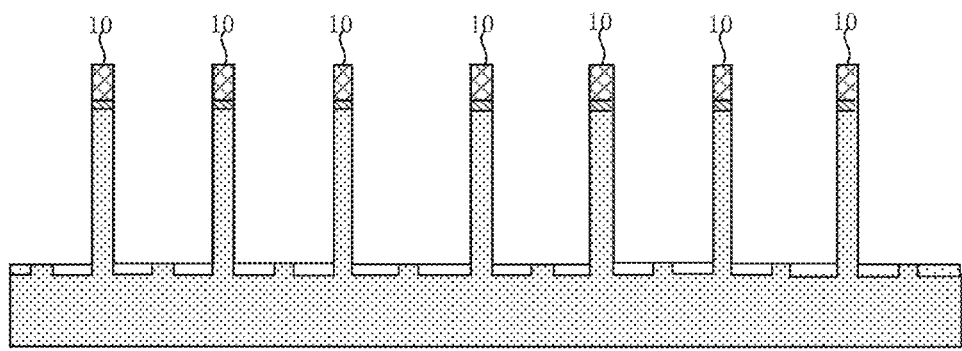
FIG. 1b illustrates a sectional structure of a device after a cut process in the prior art.

The technical solution of the present application will be clearly and completely described below with reference to the drawings. Obviously, the described embodiments are part of the embodiments of the present application, instead of all of them. Based on the embodiments in the present application, all other embodiments obtained by those skilled in the art without contributing any inventive labor still fall within the scope of protection of the present application.

FIG. 2 illustrates a flowchart of a semiconductor fin structure cut process provided by an embodiment of the present application. The semiconductor fin structure cut process includes the following steps performed sequentially:

In step S1, a semiconductor substrate is provided, a plurality of fin structures are formed on the semiconductor substrate and a gap is formed between every two adjacent fin structures.

Referring to FIG. 2a, it illustrates a sectional structure of a semiconductor with a plurality of fin structures in an embodiment of the present application.

A plurality of fin structures 110 are formed on the semiconductor substrate 100 in FIG. 2a, and a gap 120 is formed between every two adjacent fin structures 110. Each fin structure 110 includes a fin semiconductor bottom layer 111, a first fin dielectric layer 112, a fin silicon nitride layer 113, and a second fin dielectric layer 114 sequentially stacked from bottom to top. In some examples, the material of the first fin dielectric layer 112 and the second fin dielectric layer 114 is silicon oxide.

In step S2, a first dielectric layers deposited. The first dielectric layer is filled in the gaps so that all fin structures are connected into a whole to form a semiconductor with fins.

Referring to FIG. 2*b*, it illustrates a semiconductor with fins formed after step S2 in an embodiment of the present application. The semiconductor with fins 140 includes those fin structures 110 illustrated in FIG. 2*a*. A first dielectric layer 130 is filled in those gaps 120 between the fin structures 110, so that those fin structures 110 are connected into a whole to form the semiconductor with fins 140.

Figure 2C:
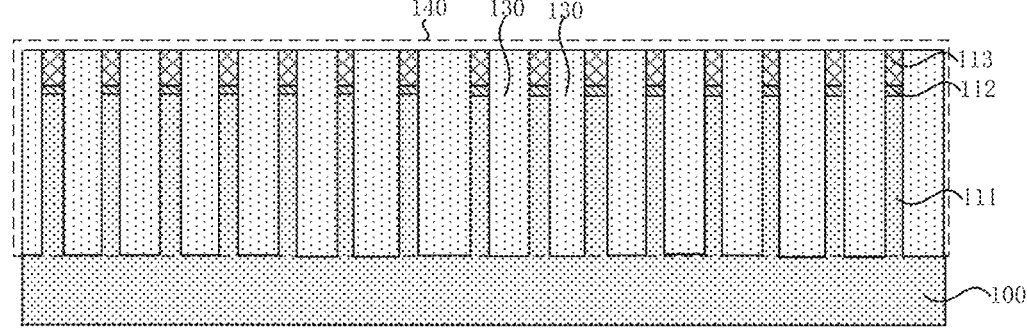
FIG. 2c illustrates a sectional structure of a fine after chemical-mechanical polishing on the basis of a structure illustrated in FIG. 2b.

After the semiconductor with fins 140 illustrated in FIG. 2*b* is formed, chemical-mechanical polishing may be performed to the semiconductor with fins 140 illustrated in FIG. 2*b* by using the fin silicon nitride layer 113 as a stop layer. The structure of the semiconductor with fins 140 formed after polishing is as illustrated in FIG. 2*c*.

In some examples, in the process of depositing the first dielectric layer, the tops of those fin structures connected into a whole may also be covered with the first dielectric layer to form a semiconductor with fins. Then, chemical-mechanical polishing is performed to a surface layer of the semiconductor with fins by using the fin silicon nitride layer as a stop layer to planarize the upper surface of the fin to form a structure illustrated in FIG. 2*c*.

In step S3, a plurality of pattern layer strips are formed on the semiconductor with fins. A groove is formed between every two adjacent pattern layer strips. The upper surface of the semiconductor with fins at the positions of the grooves is exposed. The fin structures closest to each pattern layer strip in the semiconductor with fins are necessary fin structures, and the remaining fin structures are unnecessary fin structures.

In some examples, in the process of performing step S3, the following step S31 to step S33 may be sequentially performed.

In step S31, a hard mask layer, an anti-reflection layer and a photoresist layer are sequentially formed on the semiconductor with fins.

In step S32, the photoresist layer is etched through a photolithography process so that the remaining photoresist layer forms a first pattern.

Figure 3A:
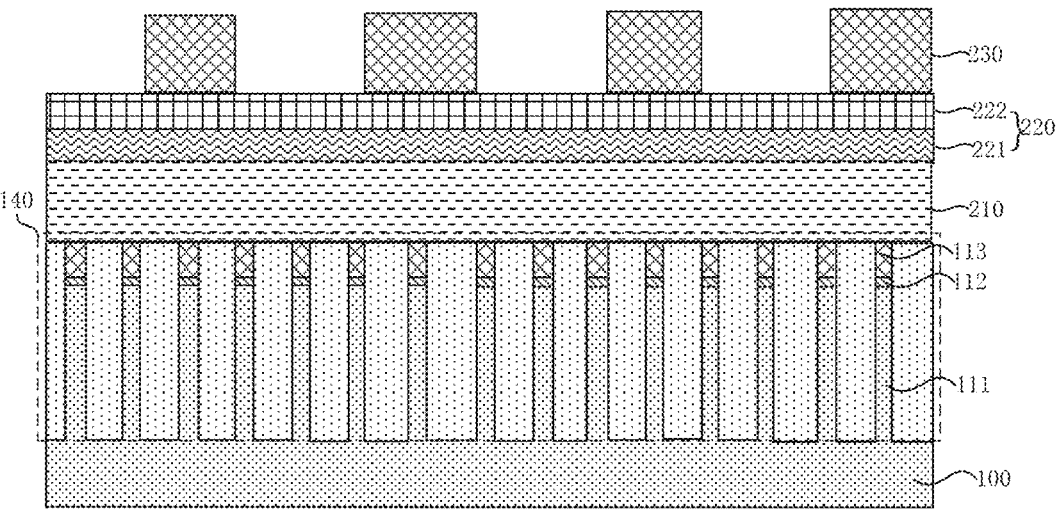
FIG. 3a illustrates a sectional structure of a device after step S31 and step S32 in an embodiment of the present application.

Referring to FIG. 3*a*, it illustrates a sectional structure of a device after step S31 and step S32 in an embodiment of the present application. In this embodiment, a mask layer 210, an anti-reflection layer 220 and a photoresist layer 230 are sequentially formed on the semiconductor with fins 140 illustrated in FIG. 2*c* from bottom to top, and the photoresist layer 230 has a first pattern.

The critical dimension of the photoresist layer 230 with the first pattern is large, and the requirement on the etching process window of the lithography process is low.

In step S33, the anti-reflection layer and the hard mask layer are etched on the basis of the photoresist layer with the first pattern, so that the first pattern is transferred into the anti-reflection layer and the hard mask layer.

Figure 3B:
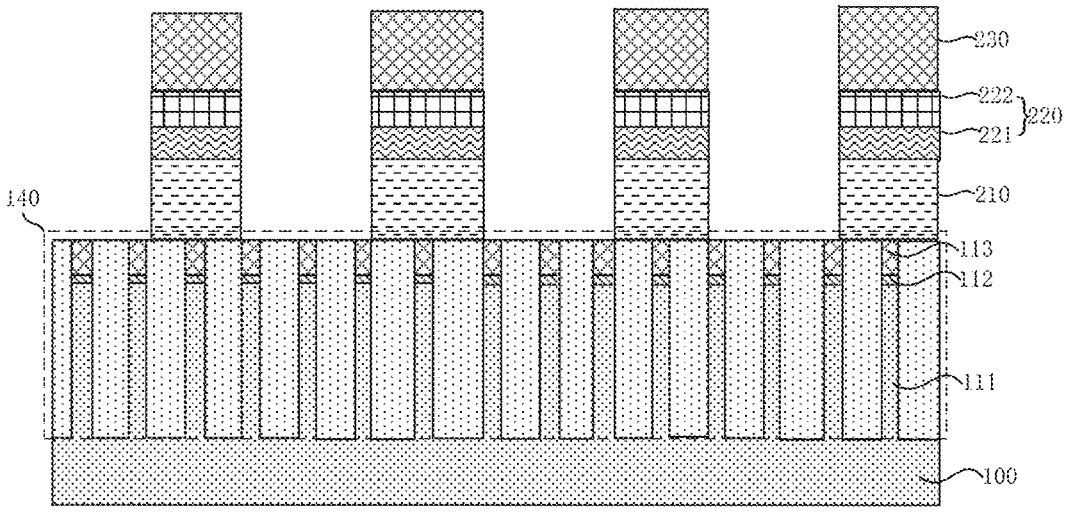
FIG. 3b illustrates a sectional structure of a device after step S33 on the basis of a structure illustrated in FIG. 3a in an embodiment of the present application.

Referring to FIG. 3*b*, it illustrates a sectional structure of a device after step S33 on the basis of a structure illustrated in FIG. 3*a* in an embodiment of the present application.

In FIG. 3*b*, the anti-reflection layer 220 and the hard mask layer 210 are patterned through step S32, so that the first pattern of the photoresist layer 230 illustrated in FIG. 3*a* is transferred into the anti-reflection layer 220 and the hard mask layer 210.

In FIG. 3*a* and FIG. 3*b*, the anti-reflection layer 220 is used to absorb the reflected light generated in the lithography process and reduce problems such as lithography reflection or standing wave. The anti-reflection layer 220 may include an enhanced Dielectric Anti-Reflection Coating (DARC) 221 and a Bottom Anti-Reflection Coating (BARC) 222 sequentially stacked from bottom to top.

In step S34, etching is performed to remove the anti-reflection layer with the first pattern and reserve the hard mask layer with the first pattern.

Figure 3C:
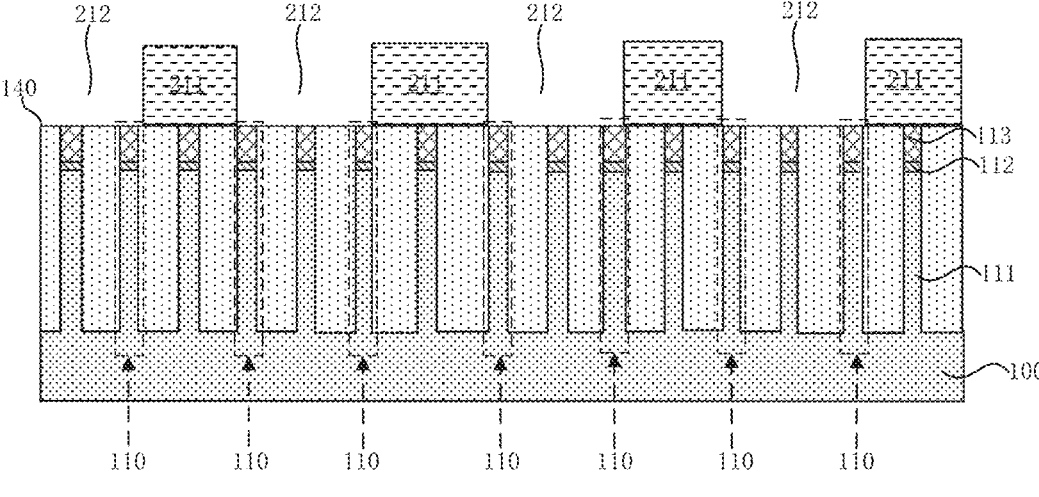
FIG. 3c illustrates a sectional structure of a device after step S34 on the basis of a structure illustrated in FIG. 3b in an embodiment of the present application.

Referring to FIG. 3*c*, it illustrates a sectional structure of a device after step S34 on the basis of a structure illustrated in FIG. 3*b* in an embodiment of the present application.

In FIG. 3*c*, the semiconductor with fins 140 is only covered with a hard mask layer with a first pattern layer. The hard mask layer with the first pattern layer includes a plurality of pattern layer strips 211, a groove 212 is formed between every two adjacent pattern layer strips 211, and the upper surface of the semiconductor with fins 140 at the positions of the grooves 212 is exposed. In FIG. 3*c*, the fin structures 110 in the dotted boxes pointed by arrows are necessary fin structures, and the remaining fin structures are unnecessary fin structures. The necessary fin structures are next to the sidewalls of the pattern layer strips 211 and are one fin structures closest to the pattern layer strips 211.

In step S4, mask strips are attached onto side surfaces of each pattern layer strip. The mask strips cover the necessary fin structures.

In some examples, the mask strips on the side surfaces of the pattern layer strips may be formed through the following step S41 to step S42.

In step S41, second dielectric is deposited, so that the second dielectric is attached onto bottom surfaces of the grooves and side surfaces and top surfaces of the pattern layer strips to form a second dielectric layer. The second dielectric layer attached onto the side surfaces of the pattern layer strips covers the fin structures closest to the side surfaces of the pattern layer strips.

In some examples, second dielectric is deposited through silicon oxide atoms at temperature ranging from 80° C. to 200° C., so that the second dielectric is attached onto the bottom surfaces of the grooves and the side surfaces and top surfaces of the pattern layer strips to form a second dielectric layer.

Figure 4A:
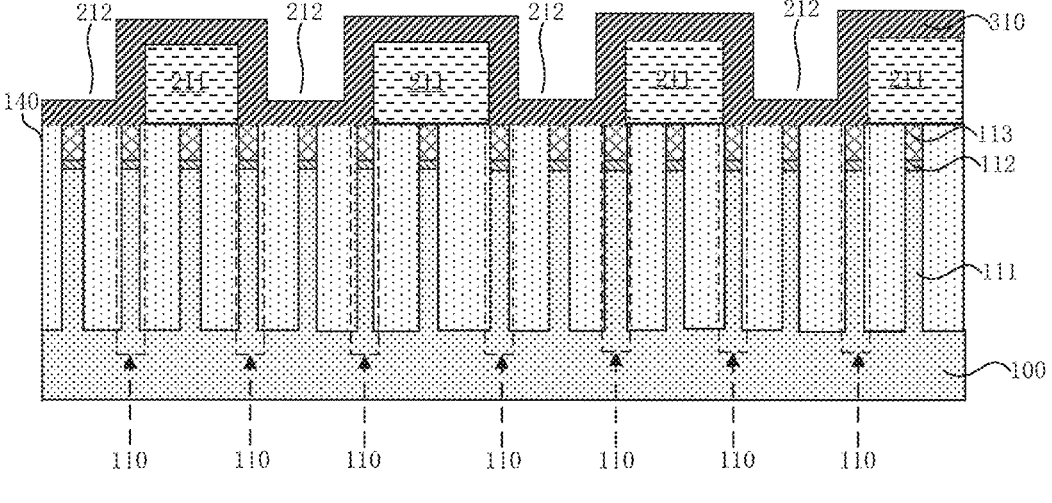
FIG. 4a illustrates a sectional structure of a device after step S41 on the basis of a structure illustrated in FIG. 3c in an embodiment of the present application.

Referring to FIG. 4*a*, it illustrates a sectional structure of a device after step S41 on the basis of a structure illustrated in FIG. 3*c* in an embodiment of the present application.

The second dielectric layer 310 covers the bottom surfaces of the grooves 210 and the side surfaces and top surfaces of the pattern layer strips 211. The second dielectric layer 310 attached onto the side surfaces of the pattern layer strips 211 covers the fin structures 110 at the positions of dotted boxes pointed by arrows in FIG. 4*a*, that is, the fin structures 110 closest to the side surfaces of the pattern layer strips 211.

In step S42, the second dielectric layer is etched to remove the second dielectric layer covering the bottom surfaces of the grooves and the top surfaces of the pattern layer strips. The remaining second dielectric layer covers the necessary fin structures to form mask strips.

Figure 4B:
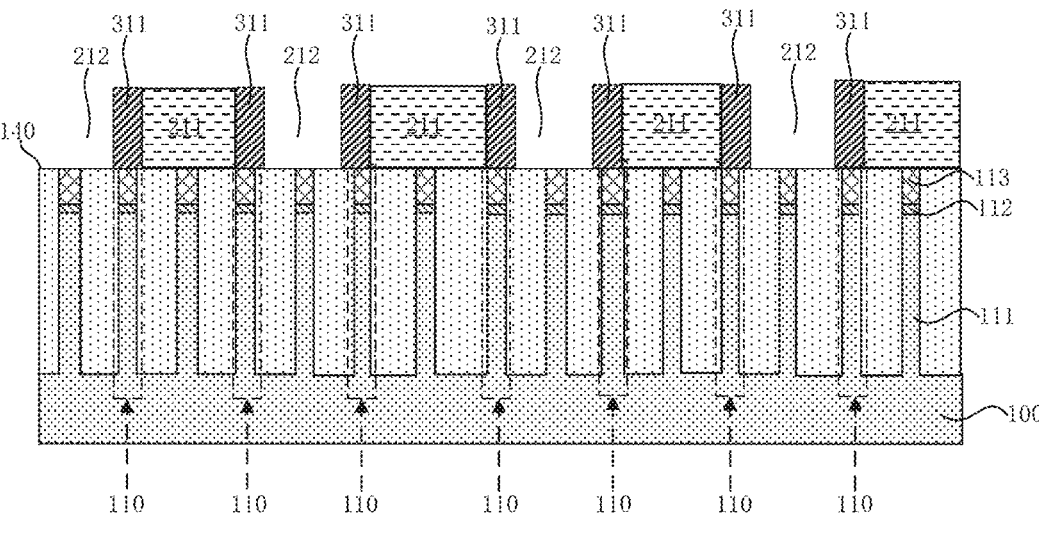
FIG. 4b illustrates a sectional structure of a device after step S42 on the basis of a structure illustrated in FIG. 4a in an embodiment of the present application.

Referring to FIG. 4*b*, it illustrates a sectional structure of a device after step S42 on the basis of a structure illustrated in FIG. 4*a* in an embodiment of the present application.

After step S42, the remaining second dielectric layer forms mask strips 311, the mask strips 311 cover the necessary fin structures 110, and the necessary fin structures 110 are fin structures 110 at the positions of dotted boxes pointed by arrows in FIG. 4a.

In the process of etching the second dielectric layer to form the mask strips, there is no need for additional lithography process. By controlling the direction of etching, anisotropic etching can be used to reserve the second dielectric layer attached onto the side surfaces of the pattern layer strips.

In step S5, the semiconductor with fins is etched on the basis of a pattern formed by the mask strips so that the unnecessary fin structures not covered by the mask strips are truncated.

Figure 5:
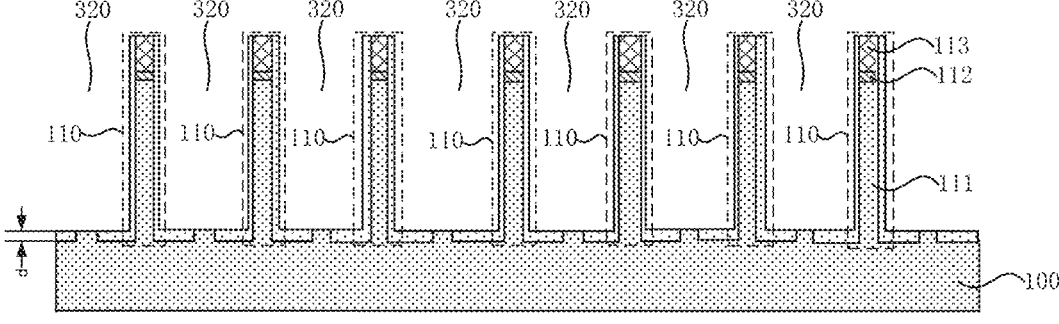
FIG. 5 illustrates a sectional structure of a device after step S5 on the basis of a structure illustrated in FIG. 4b in an embodiment of the present application.

Referring to FIG. 5, it illustrates a sectional structure of a device after step S5 on the basis of a structure illustrated in FIG. 4b in an embodiment of the present application.

As can be seen from FIG. 5, the unnecessary fin structures are truncated, the remaining fin structures 110 are necessary fin structures, and a spacing groove 320 is formed between every two adjacent necessary fin structures. After the unnecessary fin structures are truncated, roots of the unnecessary fin structures are reserved to a height d ranging from 18 nm to 22 nm in the spacing groove 320.

In this embodiment, pattern layer strips with a wide width are firstly formed on the semiconductor with fins, a groove is formed between every two adjacent pattern layer strips, then the second dielectric layer attached onto the side surfaces of the pattern layer strips are enabled to cover the fin structures closest to the side surfaces of the pattern layer strips through the second dielectric layer deposition process, and the fin structures closest to the side surfaces of the pattern layer strips are necessary fin structures. Then, the second dielectric layer is etched, and the second dielectric layer attached to the side surfaces of the pattern layer strips is reserved to form mask strips. The mask strips protect the necessary fin structures, so that after the subsequent etching according to the pattern formed by the mask strips, the necessary fin structures are reserved, and the unnecessary fin structures are truncated. The requirement of this present application on the lithography process window is low, and it can solve the problem of great difficulty in lithography in the prior art.

In other embodiments, after step S5, deposition is performed to form a third dielectric layer, so that the third dielectric layer is filled in the spacing groove between every two adjacent necessary fin structures.

Figure 6A:
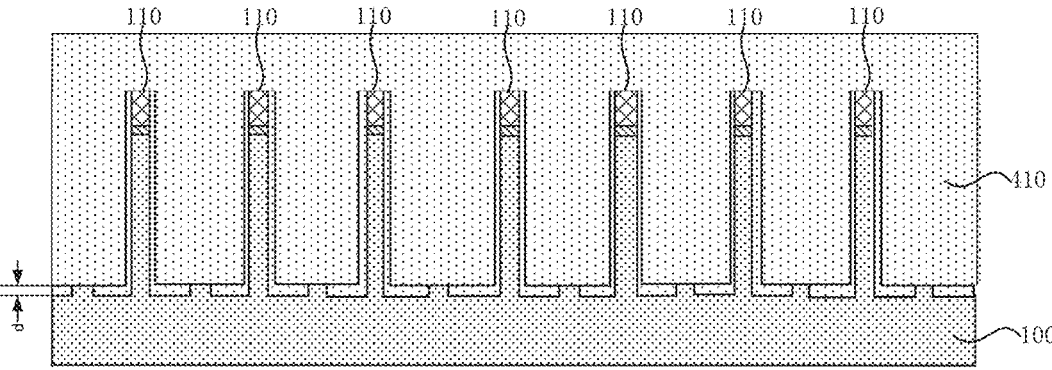
FIG. 6a illustrates a sectional structure of a device after deposition of a third dielectric layer in an embodiment of the present application.

Referring to FIG. 6a, it illustrates a sectional structure of a device after deposition of a third dielectric layer. The formed third dielectric layer 410 is filled in the spacing grooves 230 illustrated in FIG. 5.

Figure 6B:
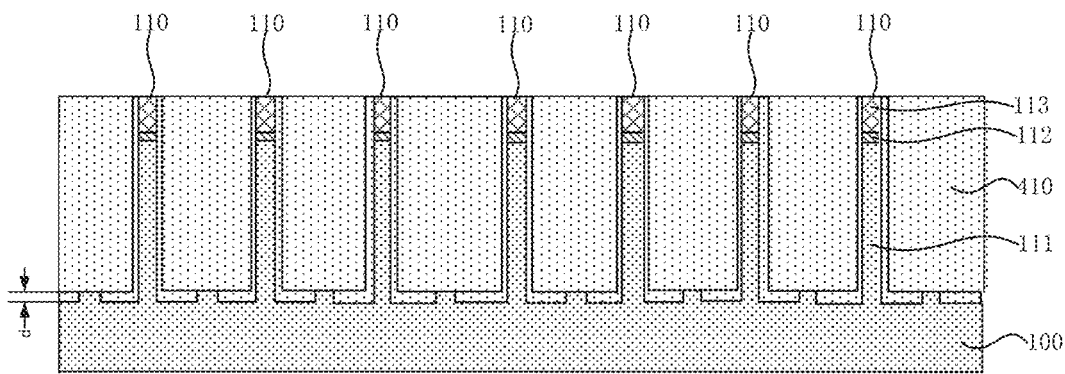

On the basis of the device structure illustrated in FIG. 6a, chemical-mechanical polishing is performed by using the fin silicon nitride layer 113 of the fin structure 110 as a stop layer, so that an upper surface of the third dielectric layer 410 is planarized to form a device structure illustrated in FIG. 6b.

Obviously, the above embodiments are only examples for clear description, instead of limitations to the embodiments. For those skilled in the art, other changes or variations in different forms may be made on the basis of the above description. It is unnecessary and impossible to enumerate all embodiments here. Obvious changes or variations derived thereby are still within the scope of protection of the present application.

What is claimed is:

1. A semiconductor fin structure cut process, wherein the semiconductor fin structure cut process comprises the following steps performed sequentially:

providing a semiconductor substrate and forming a plurality of fin structures on the semiconductor substrate, a gap being formed between every two adjacent fin structures;

depositing a first dielectric layer, the first dielectric layer being filled in the gaps so that all of the fin structures are connected into a whole to form a semiconductor with fins;

forming a plurality of pattern layer strips on the semiconductor with fins, a groove being formed between every two adjacent pattern layer strips, an upper surface of the semiconductor with fins at positions of the grooves being exposed, the fin structures closest to each pattern layer strip in the semiconductor with fins being necessary fin structures, and remaining fin structures being unnecessary fin structures;

attaching mask strips onto side surfaces of each pattern layer strip, the mask strips covering the necessary fin structures; and etching the semiconductor with fins on the basis of a pattern formed by the mask strips so that the unnecessary fin structures not covered by the mask strips are truncated.

2. The semiconductor fin structure cut process according to claim 1, wherein the depositing the first dielectric layer, the first dielectric layer being filled in the gaps so that all of the fin structures are connected into the whole to form the semiconductor with fins comprises:

depositing the first dielectric layer, the first dielectric layer being filled in the gaps so that all fin structures are connected into a whole; and enabling tops of the fin structures connected into a whole to be covered with the first dielectric layer to form the semiconductor with fins.

3. The semiconductor fin structure cut process according to claim 2, wherein after the semiconductor with fins is formed, the semiconductor fin structure cut process further comprises:

performing chemical-mechanical polishing to a surface layer of the fin to planarize the upper surface of the semiconductor with fins.

4. The semiconductor fin structure cut process according to claim 1, wherein the attaching the mask strips onto the side surfaces of each pattern layer strip, the mask strips covering the necessary fin structures comprises:

depositing a second dielectric, so that the second dielectric is attached onto bottom surfaces of the grooves and side surfaces and top surfaces of the pattern layer strips to form a second dielectric layer, the second dielectric layer attached onto the side surfaces of the pattern layer strips covering the fin structures closest to the side surfaces of the pattern layer strips; and etching the second dielectric layer to remove second dielectric layer covering the bottom surfaces of the grooves and the top surfaces of the pattern layer strips, a remaining second dielectric layer covering the necessary fin structures to form mask strips.

5. The semiconductor fin structure cut process according to claim 4, wherein the depositing the second dielectric comprises:

depositing the second dielectric through silicon oxide atoms at a temperature ranging from 80° C. to 200° C., so that the second dielectric is attached onto the bottom surfaces of the grooves and the side surfaces and the top surfaces of the pattern layer strips to form the second dielectric layer.

6. The semiconductor fin structure cut process according to claim 1, wherein the forming the plurality of pattern layer strips on the semiconductor with fins, the groove being formed between every two adjacent pattern layer strips, the upper surface of the semiconductor with fins at the positions of the grooves being exposed comprises:

sequentially forming a hard mask layer, an anti-reflection layer and a photoresist layer on the semiconductor with fins;

etching the photoresist layer through a photolithography process so that a remaining photoresist layer forms a first pattern;

etching the anti-reflection layer and the hard mask layer on the basis of the photoresist layer with the first pattern, so that the first pattern is transferred into the anti-reflection layer and the hard mask layer; and performing etching to remove the anti-reflection layer with the first pattern and reserve the hard mask layer with the first pattern.

7. The semiconductor fin structure cut process according to claim 6, wherein the anti-reflective layer with the first pattern comprises a plurality of the pattern layer strips, and the groove is formed between every two adjacent layer strips.

8. The semiconductor fin structure cut process according to claim 1, wherein after the etching the semiconductor with the fins on the basis of the pattern formed by the mask strips so that the unnecessary fin structures not covered by the mask strips are truncated, roots of the unnecessary fin structures are reserved to a height ranging from 18 nm to 22 nm.

9. The semiconductor fin structure cut process according to claim 1, wherein after the etching the semiconductor with fins on the basis of the pattern formed by the mask strips so that the unnecessary fin structures not covered by the mask strips are truncated, the semiconductor fin structure cut process further comprises:

forming a third dielectric layer through deposition so that the third dielectric layer is filled in a spacing groove between every two adjacent necessary fin structures.

10. The semiconductor fin structure cut process according to claim 9, wherein after the forming the third dielectric layer through deposition so that the third dielectric layer is filled in the spacing groove between every two adjacent necessary fin structures, an upper surface of the third dielectric layer is planarized through chemical-mechanical polishing.

\* \* \* \* \*